United States Patent
Tsuchida et al.

(10) Patent No.: US 6,861,732 B2
(45) Date of Patent: Mar. 1, 2005

(54) POWER SOURCE CIRCUIT DEVICE

(75) Inventors: Mitsuho Tsuchida, Sapporo (JP); Madoka Nishikawa, Oizumi-machi (JP); Kenji Ikeda, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/333,133
(22) PCT Filed: May 17, 2002
(86) PCT No.: PCT/JP02/04774
§ 371 (c)(1), (2), (4) Date: Sep. 5, 2003
(87) PCT Pub. No.: WO02/095824
PCT Pub. Date: Nov. 28, 2002

(65) Prior Publication Data
US 2004/0026770 A1 Feb. 12, 2004

(30) Foreign Application Priority Data
May 18, 2001 (JP) ........................ 2001-149636

(51) Int. Cl.$^7$ .......................................... H01L 23/495
(52) U.S. Cl. .................... 257/666; 257/690; 257/692
(58) Field of Search ................ 257/666, 690, 257/692–694, 696–697

(56) References Cited

U.S. PATENT DOCUMENTS 5,814,884 A * 9/1998 Davis et al. ............... 257/723
6,459,147 B1 * 10/2002 Crowley et al. ............ 257/692
2002/0047187 A1 * 4/2002 Nakajima et al. .......... 257/666
2003/0095393 A1 * 5/2003 Tu et al. .................... 361/773

FOREIGN PATENT DOCUMENTS

| JP | 63-87758 A | 4/1988 |
| JP | 3-93257 A | 4/1991 |

* cited by examiner

Primary Examiner—Ngân V. Ngô
Assistant Examiner—Theresa T. Doan
(74) Attorney, Agent, or Firm—Morrison & Foerster LLP

(57) ABSTRACT

In a conventional power circuit device, such as a power MOSFET monolithic integrated circuit device and a compound device, since five lead pins are lead out from the packaging with even intervals, sufficient separation distances between the third pin of a high voltage and other adjacent pins cannot be secured. According to this invention, the distances between the third pin and other adjacent pins are expanded so as to become wider than the distances between other pins. Furthermore, the third pin is formed into an upper position, its adjacent pins are formed into a lower position, and other pins are formed into a middle position. Thereby, sufficient separation distances between the third pin of the high voltage and other adjacent pins can be secured. Therefore, a structure favorable in terms of safety can be provided. Furthermore, by providing a full-mold packaging, the header portion is not exposed to assure an easy handling.

10 Claims, 2 Drawing Sheets

Prior Art

POWER SOURCE CIRCUIT DEVICE

BACKGROUND OF THE INVENTION

1. Field of the Invention

This invention relates to a power-supply circuit device, specifically, to a power-supply circuit device using an IC packaging improved in the shape of leads led out from a main packaging body.

2. Description of the Related Art

As widely known, IC (integrated circuit) packaging in which an IC chip and leads (lead pins) are connected by wire bonding or the like and packaged in a main packaging body made of a resin has been employed.

FIGS. 2(A)–2(C) show, as an example, a conventional IC packaging with five lead pins. FIG. 2(A) is a top view, FIG. 2(B) is a sectional view along line B—B of FIG. 2(A), and FIG. 2(C) is a side view viewed from the arrow direction shown in FIG. 2(B).

In a monolithic IC, a composite device or the like, which includes a power MOSFET (metal-oxide-semiconductor field effect transistor) 11, because an IC 12 is mounted on the power MOSFET 11, five lead pins with even pin-pitch intervals (d3) are generally used. As shown in FIG. 2(A), on one side wall of this main packaging body 13, five lead pins 14 are provided. In this case, a third pin 14c at the center is connected to a drain terminal of the MOSFET 11, a fifth pin 14e is connected to a source terminal of the MOSFET, and a first pin 14a, a second pin 14b, and a fourth pin 14d are connected to corresponding control terminals of the IC 12. Normally, since a high voltage is applied to the drain terminal of the MOSFET 11 and the source terminal is grounded, the voltage difference between the terminals is extremely large. Therefore, the third pin 14c and fifth pin 14e are used so that the lead pins 14 are not adjacent.

FIG. 2(B) shows a forming of this packaging. As shown in the drawing, the first pin 14a, third pin 14c and fifth pin 14e are bent upward, whereby separation distances from the adjacent second pin 14b and the fourth pin 14d are increased (see FIG. 2(C)). This method is used when an IC packaging having such a structure is mounted on a circuit board surface by soldering so as to suppress occurrence of a short circuit between adjacent lead pins and occurrence of solder bridging when an IC packaging is solder-jointed on a printed circuit board.

In general, for convenience of assembly, lead pins are arranged at even intervals (d3), and the back surface of an internal device is connected to the central pin. Namely, in a case of a power MOSFET, a drain electrode on its back surface is directly fixed by a conductive adhesive. Conventional power MOSFET packaging structures are of a three-pin structure and have sufficient separation distances between a terminal (central terminal), to which the drain receiving a high voltage is connected, and other adjacent terminals. However, in a monolithic integrated circuit, a composite device or the like, which includes a power MOSFET as described above, because the IC is mounted on the power MOSFET, five lead pins with even intervals are generally used. In this case as well, the center third pin is connected to the drain electrode of the power MOSFET. Therefore, when a power MOSFET having a high withstand voltage, such as 800V, is mounted, sufficient separation distances between the central third pin and other adjacent pins cannot be secured with the conventional lead pin structure that includes lead pins separated by even intervals.

Namely, when an IC packaging of such a structure is mounted on a circuit board surface by soldering, if the separation distances between the third pin receiving a high voltage and adjacent second and fourth pins are small, a short circuit due to dusts or the like easily occurs. Furthermore, when an IC packaging is solder-jointed on a printed circuit board, solder bridging easily occurs since solders spread wider than the distances between lead pins. For example, if the operating voltage is 700V, the separation distances need to be 1.9 mm. Thus, in the conventional structure, if the separation distances are about 1.7 mm, safety standards may not be satisfied even with the forming of bending lead pins in the up-and-down direction. In short, in the conventional lead pin structure, the separation distances cannot be sufficiently secured.

Furthermore, in the conventional packaging, since a header 14h part, which forms an integral part with the third pin and connected to the drain electrode receiving a voltage as high as 800V, is configured to exposed, product handling is not safe.

SUMMARY OF THE INVENTION

This invention is directed to solving above problems. First, the invention provides a power-supply circuit device that includes a MOSFET, a packaging sealing the MOSFET therein, and a plurality of lead pins led out from a side wall of the main body of this packaging. The drain terminal of the MOSFET is connected to the central lead pin of the plurality of lead pins. In this configuration, proper separation distances are obtained by making the intervals between the central lead pin of a high voltage and its adjacent lead pins greater than the intervals between the other lead pins.

In addition, the packaging has a full-mold structure.

In addition, an IC is mounted on the MOSFET.

Second, the invention provides a power-supply circuit device that includes-a MOSFET, a packaging sealing the MOSFET therein, and a plurality of lead pins led out from a side wall of the main body of this packaging. The drain terminal of the MOSFET is connected to the central lead pin of the plurality of lead pins. In this configuration, proper separation distances are obtained by making the intervals between the central lead pin of a high voltage and its adjacent lead pins greater than the intervals between the other lead pins. Furthermore, the lead pins of the lowest voltage of the plurality of lead pins are bent to a lower position, the central lead pin is bent to an upper position, and the other lead pins are bent to a middle position between the upper position and the lower position. This structure assures proper separation distances between the central lead pin of the high voltage and the lead pin of the low voltage.

In addition, the packaging has a full-mold structure.

In addition, an IC is mounted on the MOSFET.

Third, the invention provides a power-supply circuit device that includes a MOSFET, a packaging sealing the MOSFET therein, and five lead pins led out from a side wall of a main body of the packaging. The drain terminal of the MOSFET is connected to a third lead pin located at the center. In this configuration, proper separation distances between the third lead pin and adjacent second and fourth lead pins receiving a low voltage are obtained by making intervals between the third lead pin receiving a high voltage and other lead pins adjacent thereto greater than intervals between the other lead pins.

In addition, the intervals between the third lead pin and the second and fourth lend pins is greater than the intervals between the first and second lead pins and the fourth and fifth lead pins.

In addition, by bending the second and fourth lead pins into a lower position, and the third lead pin, into an upper position, and the first and fifth lead pins, into a middle position between the upper position and lower position, desirable separation distances are provided between the third lead pin and the second and fourth lead pins.

In addition, the packaging has a full-mold structure.

Furthermore, an IC is mounted on the MOSFET.

In short, by expanding the intervals between the third pin of the high voltage and its adjacent lead pins, and by forming the lead pins into three positions, i.e., an upper position, a middle position and a lower position, safe separation distances are secured.

In addition, by creating the main packaging body of a full-mold structure, the frame on the back surface of the packaging, which is formed in the same process step as the third pin, is not exposed. Therefore, the packaging can be safely handled even when the high voltage is applied to the drain terminal.

DETAILED DESCRIPTION OF THE INVENTION

An embodiment of this invention will be described in detail with reference to FIGS. 1(A)–1(B) by taking a packaging with five lead pins as an example.

Figure 1A:
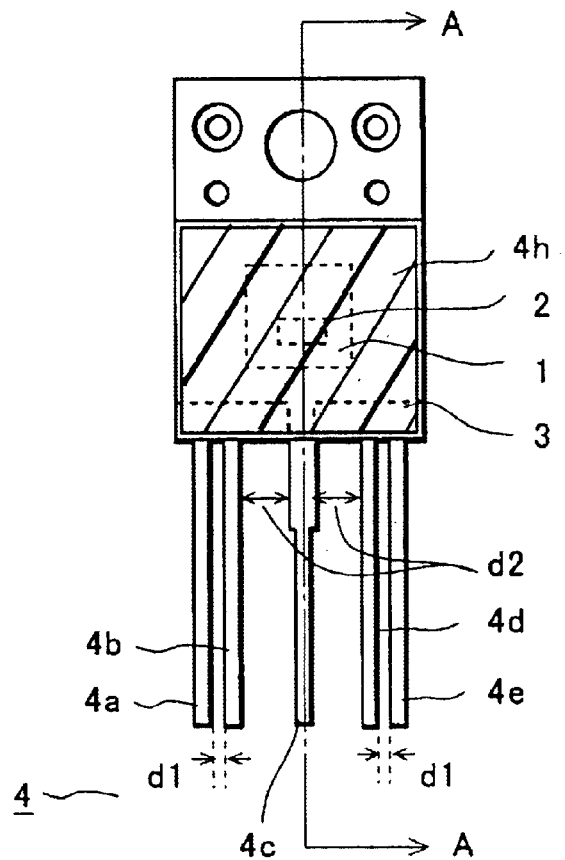
FIG. 1(A) is a top view for explaining a power-supply circuit device of this invention.
Figure 1B:
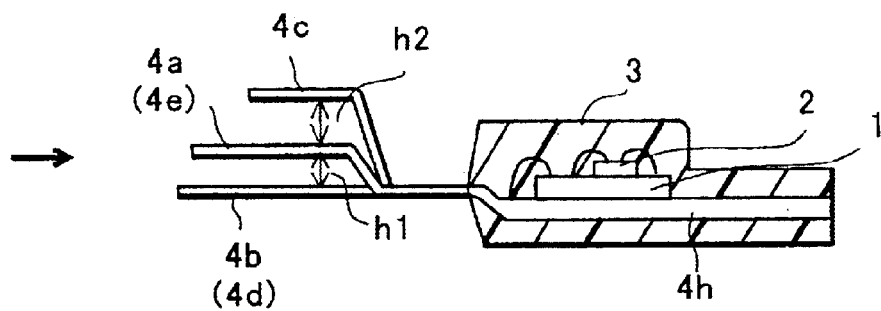
FIG. 1(B) is a sectional view along A—A line of FIG. 1(A)
Figure 1C:
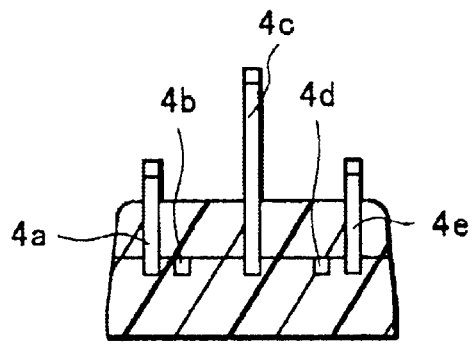
FIG. 1(C) is a side view viewed from the arrow direction shown in FIG. 1(B).
Figure 2A:
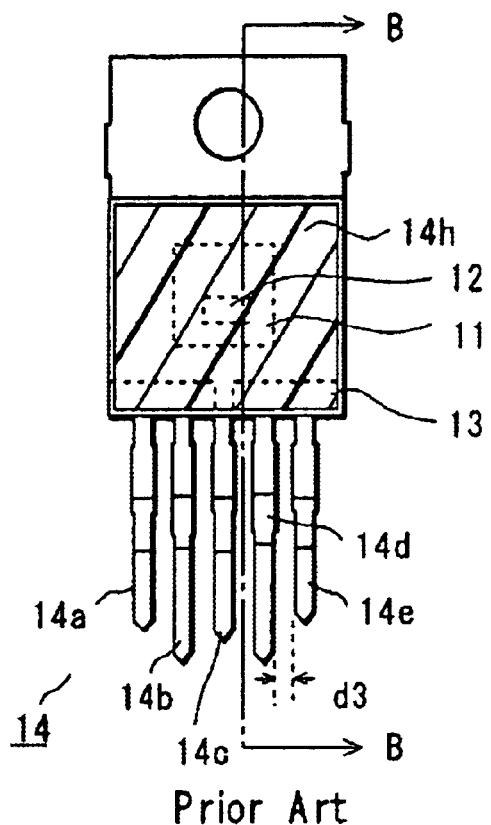
FIG. 2(A) is a top view for explaining a conventional power-supply circuit device.
Figure 2B:
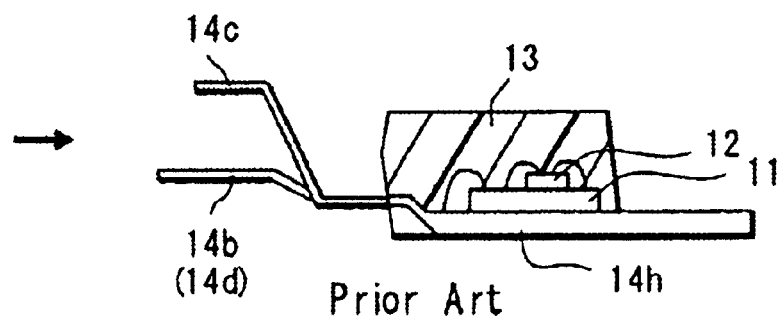
FIG. 2(B) is a sectional view along the B—B line of FIG. 2(A)
Figure 2C:
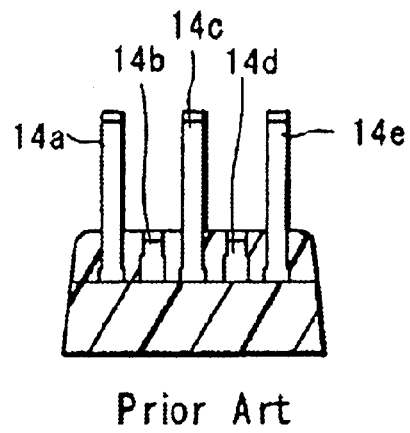
FIG. 2(C) is a side view viewed from the arrow direction shown in FIG. 2(B).

FIG. 1(A) is a top view, FIG. 1(B) is a sectional view along A—A line of FIG. 1(A), and FIG. 1(C) is a side view viewed from the arrow direction shown in FIG. 1(B).

A power-supply circuit device of this invention includes a MOSFET 1, an IC 2, and a packaging 3, and five lead pins 4.

The MOSFET 1 contains a large number of MOSFET cells. Its back surface is a drain electrode, which is fixed by a conductive adhesive to a header 4h that is formed as an integral unit with the third pin 4c (see FIG. 1(B)).

The IC 2 is mounted on the MOSFET 1 and connected to a source electrode and the drain electrode of the MOSFET 1. Furthermore, respective control terminals are connected to a first pin 4a, a second pin 4b, and a fourth pin 4d (see FIG. 1(B)).

The packaging 3 is formed by sealing the MOSFET 1 and IC 2 with an insulating resin through transfer molding or the like. Since the packaging 3 is of a full-mold structure, the back surface of the header 4h of the leads, to which the drain electrode of the MOSFET 1 is fixed, is covered by the resin and the header 4h, to which a high voltage is applied, is not exposed. Therefore, handling of such a device is safe.

The five lead pins 4 are led out from a side wall of the main packaging body 3. Herein, as illustrated, a first pin 4a, a second pin 4b, a third pin 4c, a fourth pin 4d, and a fifth pin 4e are provided in this order from one end. The third pin 4c located at the center is formed as an integral unit with the header 4h, and the drain electrode of the MOSFET 1 is connected to the header 4. Thereby, the third pin 4c is a drain terminal, and the fifth pin 4e is a source terminal. The first pin 4a, second pin 4b and fourth pin 4d are control terminals of the IC 2. The proper intervals (d2) between the third pin 4c of the highest voltage and its adjacent second and fourth pins 4b, 4d are secured by the separation distances satisfying safety standards because the intervals are wider than the interval d1 between the first pin 4a and second pin 4b and the interval d1 between the fourth pin 4d and fifth pin 4e. Specifically, for example, the intervals d2 between the third pin 4c and second pin 4b and between the third pin 4c and fourth pin 4d are about 2.54 mm, and the intervals d1 between the first pin 4a and second pin 4b and between the fourth pin 4d and fifth pin 4e are about 0.5 mm. A safe separation distance for an operating voltage of 700V is about 1.9 mm, and it is about 2.1 mm for 800V. Thus, according to the structure of this invention, the intervals between the third pin 4c of the high voltage and the second and fourth pins 4b, 4d are sufficient.

Furthermore, as shown in FIG. 1(B) and FIG. 1(C), the lead pins 4 led out from the packaging 3 are formed by bending the pins along the up-and-down direction, i.e., the vertical direction perpendicular to the header 4h, into three positions, i.e., an upper position, a middle position and a lower position. Herein, the second pin 4b and fourth pin 4d are at the lower position without bending. The third pin 4c is bent to the highest level to be at the upper position. The first pin 4a and fifth pin 4e are formed between the upper position and lower position to be at the middle position. Specifically, the interval h1 between the lower position and the middle position is about 2.3 mm, and the interval h2 between the middle position and the upper position is about 2.8 mm. Furthermore, depending on the angles of the forming, the distance between the tip portions of the lead pins 4 for soldering can be further expanded in the up-and-down directions to a desirable distance.

A feature of this invention is the arrangement of the lead pins 4. By expanding the intervals between the third pin 4c of the high voltage and its adjacent second and fourth pins 4b, 4d so as to be wider than the intervals between the first and second pins 4a, 4b and between the fourth and fifth pins 4d, 4e, the separation distances in the horizontal direction with respect to the header 4h can be secured. Furthermore, by forming the third pin 4c in the upper position, the first and fifth pins 4a, 4e in the middle position, and the second and fourth pins 4b, 4d in the lower position, the separation distances between the third pin 4c and the adjacent second and fourth pins 4b,4d can also be increased in the vertical direction with respect to the header 4h.

As mentioned above, even when sufficient separation distances are obtained before the forming, since solders spread on a printed circuit board when a device chip is mounted on the printed circuit board, it is preferable to secure the separation distances as large as possible for preventing short circuits due to solder bridging and dusts. That is, in addition to separating the lead pins 4 in the horizontal direction by the forming, the separation distances are expanded in the vertical direction as well, by forming the third pin 4c of the highest voltage into the upper position and the adjacent second and fourth pins 4b, 4d into the lower position. This prevents the short circuits, and thus a safe packaging is realized.

In addition, since the packaging is of a full-mold structure, the back surface of the header 4h, to which the drain electrode receiving the high voltage is fixed, is not exposed. Therefore, product handling is safe and easy.

According to this invention, by expanding the intervals between the third pin of the high voltage and its adjacent lead pins so as to become wider than the intervals between other lead pins, the separation distances is secured in the horizontal direction with respect to the header. Furthermore, by forming the third pin into the upper position, the first and fifth pins into the middle position, and the second and fourth pins into the lower position, the lead pins are made apart in the vertical direction with respect to the header as well. Thus, the separation distances between the third pin and the adjacent second and fourth pins can further be expanded. Expanding the separation distances prevents the short circuits due solder bridging and dusts on the printed wiring board.

Specifically, for example, the separation distances of 2.1 mm is necessary with an application of 800V. When the separation distance of about 1.7 mm is provided in the conventional device with five pins arranged at even intervals, the distances are not adequate for a safe operation. However, according to the structure of this invention, the intervals between the third pin and the adjacent second and fourth pins can be expanded to 2.54 mm. Furthermore, a distance as large as 5.8 mm can be secured between the upper position and the lower position. In addition, the distance between the tip portions of the lead pins can be further expanded depending on the angles of the forming. Therefore, the separation distances for a safe operation is secured.

In addition, since the packaging is of a full-mold structure, the back surface of the header 4h, to which the drain electrode receiving the high voltage is fixed, is not exposed. Therefore, product handling is safe and easy.

What is claimed is:

1. A power-supply circuit device comprising:
   a metal-oxide-semiconductor field effect transistor;
   a packaging sealing the transistor therein; and
   a plurality of lead pins protruding from a side wall of the packaging, a drain terminal of the transistor being connected to one of the lead pins, wherein
   a separation between the lead pin connected to the drain terminal and one of the lead pins that is disposed next to the lead pin connected to the drain terminal is larger than a separation between two of the lead pins that are not the lead pin connected to the drain terminal.

2. The power-supply circuit device of claim 1, wherein the packaging comprises a full-mold structure.

3. The power-supply circuit device of claim 1, further comprising an integrated circuit mounted on the transistor.

4. A power-supply circuit device comprising:
   a metal-oxide-semiconductor field effect transistor;
   a packaging sealing the transistor therein;
   a high voltage lead pin connected to a drain terminal of the transistor and receiving the highest voltage;
   a low voltage lead pin disposed next to the high voltage lead pin and receiving the lowest voltage; and
   a plurality of medium voltage lead pins receiving corresponding voltages between the highest and lowest voltages, the high voltage, medium voltage and low voltage lead pins protruding from a side wall of the packaging, wherein
   a separation in a horizontal plane relative to a primary plane of the transistor between the high voltage lead pin and the low voltage lead pin is larger than a separation in the horizontal plane between two of the lead pins that are not the high voltage lead pin, and
   a far end of the high voltage lead pin is disposed at a high position in a vertical direction relative to the primary plane of the transistor, a far end of the low voltage lead pin is disposed at a low position in the vertical direction, and far ends of the medium voltage lead pins are disposed at a middle position in the vertical direction between the high and low positions.

5. The power-supply circuit device of claim 4, wherein the packaging comprises a full-mold structure.

6. The power-supply circuit device of claim 4, further comprising an integrated circuit mounted on the transistor.

7. A power-supply circuit device comprising:
   a metal-oxide-semiconductor field effect transistor;
   a packaging sealing the transistor therein; and
   a first lead pin, a second lead pin, a third lead pin, a fourth lead pin and a fifth lead pin that are disposed on a side wall of the packaging in the order thereof, a drain terminal of the transistor being connected to the third lead pin, wherein
   separations in a horizontal plane relative to a primary plane of the transistor between the second and third lead pins and between the third and fourth lead pins are larger than separations in the horizontal plane between the first and second lead pins and between the fourth and fifth lead pins.

8. The power-supply circuit device of claim 7, wherein a far end of the third lead pin is disposed at a high position in a vertical direction relative to the primary plane of the transistor, far ends of the second and fourth lead pins are disposed at a low position in the vertical direction, and far ends of the first and fifth lead pins are disposed at a middle position in the vertical direction between the high and low positions.

9. The power-supply circuit device of claim 7, wherein the packaging comprises a full-mold structure.

10. The power-supply circuit device of claim 7, further comprising an integrated circuit mounted on the transistor.

* * * * *